United States Patent [19]

Cote

[11] Patent Number: 4,869,778
[45] Date of Patent: Sep. 26, 1989

[54] METHOD OF FORMING A PATTERNED ALUMINUM LAYER AND ARTICLE

[75] Inventor: Paul F. Cote, Milford, N.H.

[73] Assignee: Gardoc, Inc., Milford, N.H.

[21] Appl. No.: 75,397

[22] Filed: Jul. 20, 1987

[51] Int. Cl.[4] .............................................. C23F 1/02
[52] U.S. Cl. ................................... 156/635; 156/656; 156/660; 156/659.1; 156/665; 252/79.5; 252/79.2; 427/43.1; 427/44; 427/54.1; 427/272
[58] Field of Search ..................... 156/659.1, 660, 665, 156/635, 652, 656; 252/79.5, 79.2; 427/272, 44, 54.1, 43.1

[56] References Cited

U.S. PATENT DOCUMENTS

| | | | |
|---|---|---|---|
| 3,898,095 | 8/1975 | Berdan et al. | 156/665 X |
| 4,136,026 | 1/1979 | Meyer et al. | 252/79.5 X |
| 4,372,805 | 2/1983 | Takahashi et al. | 252/79.5 X |
| 4,398,994 | 8/1983 | Beckett | 156/659.1 |
| 4,555,414 | 11/1985 | Hoover et al. | 427/54.1 X |

Primary Examiner—David L. Lacey
Assistant Examiner—Thi Dang
Attorney, Agent, or Firm—John C. Fox

[57] ABSTRACT

A process is described for the microdemetalization of an aluminized mylar film, the steps including the printing of a micropattern of a caustic resistant, U.V. curable resin on the aluminum surface, etching of the exposed aluminum with a warm saturated caustic solution, followed immediately by rinsing the patterned surface with an acidic solution to neutralize the caustic and stop the etching. Micropatterns having line widths as small as 0.2 mils may be formed by the process.

17 Claims, 1 Drawing Sheet

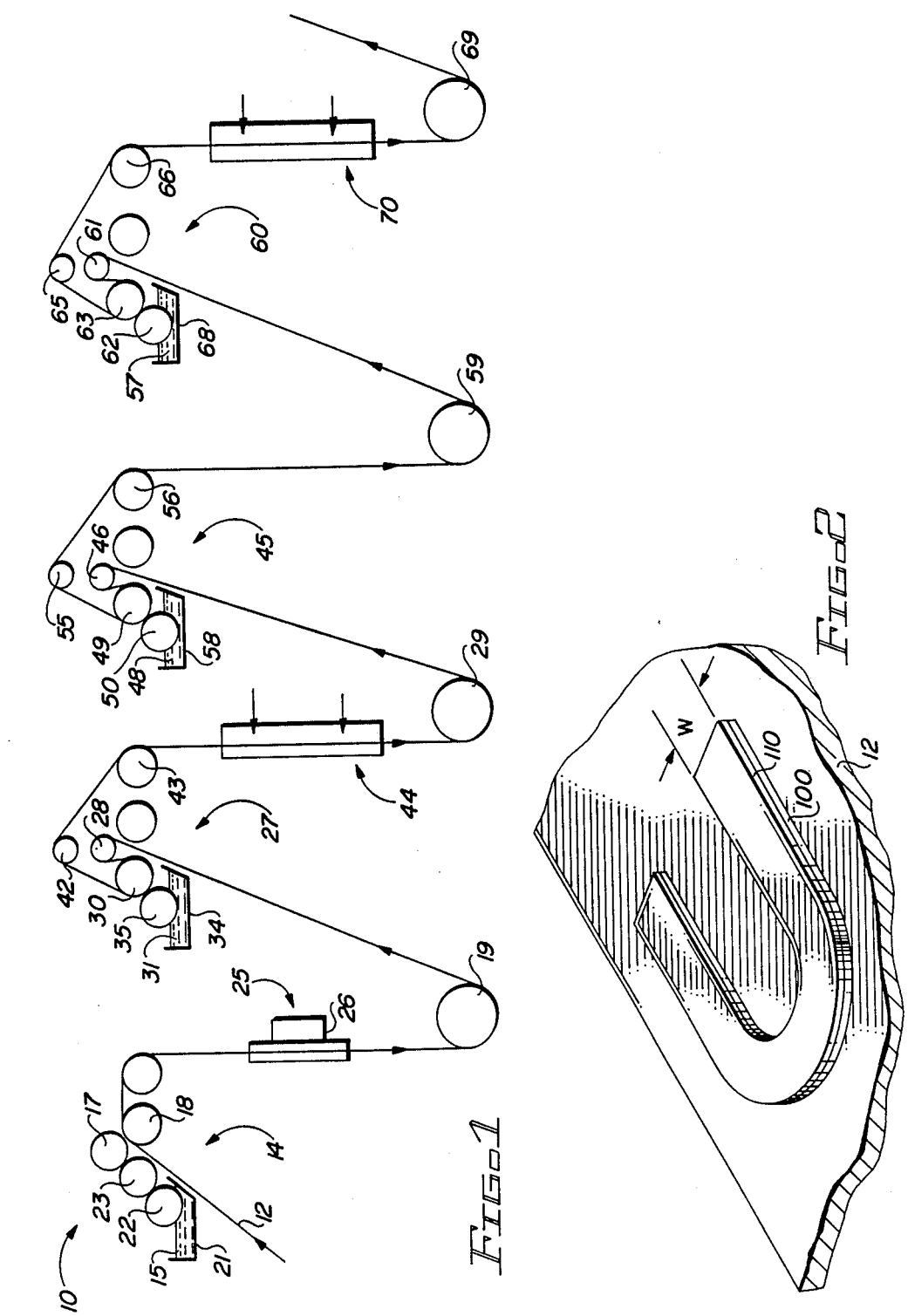

METHOD OF FORMING A PATTERNED ALUMINUM LAYER AND ARTICLE

BACKGROUND OF THE INVENTION

This invention relates to a method for forming a patterned aluminum layer on a substrate, and more particularly relates to a method for forming such a pattern by the selective etching of an aluminized web, and also relates to the article resulting from the method.

The formation of patterns by the selective etching of an aluminized web is known from U.S. Pat. No. 4,398,994, issued to Donald E. Beckett on Aug. 16, 1983. In that patent, the pattern is formed in a rapid and continuous manner on an aluminized polymer film by printing the aluminum surface with a pattern of a caustic resistant masking material such as a water-insoluble resin, contacting the surface with a dilute solution of warm caustic to dissolve the exposed aluminum, and washing the spent solution from the film.

The polymer film is typically aluminized by vacuum evaporation, and the thickness of the resultant aluminum layer is said to vary widely, from about 10 to 1000 Angstroms, preferably 300 to 600 Angstroms.

The caustic solution has a concentration of up to about 25 weight percent of sodium hydroxide, preferably about 5 to 10 percent, and is maintained at a temperature of from about 15 to 100 degrees C., preferably about 50 degrees C.

For certain specialized applications, it is desired to form a micropattern of aluminum on a transparent backing such as a polymer film. As used herein, the term "micropattern" is intended to refer to any pattern at least a portion of which has minimum dimensional elements (e.g., lines or dots) of from about 0.2 to 2 mils.

When it is attempted to form such micropatterns by the above described technique, the caustic solution is found to undercut the edges of the mask and attack the underlying aluminum. Depending upon the etching conditions and the line width of the pattern, the underlying aluminum layer can be substantially or entirely removed.

Accordingly, it is an object of the invention to provide a method for producing a pattern of aluminum by the selective removal of aluminum from a substrate.

It is another object of the invention to provide such a method in which a micropattern of aluminum can be produced.

It is still another object of the invention to provide such a method in which the micropattern can be produced rapidly and continuously.

SUMMARY OF THE INVENTION

In accordance with the invention, it has been discovered that micropatterns of aluminum can be produced rapidly and continuously through the selective removal of aluminum from a substrate, by contacting a masked aluminum layer with a warm, essentially saturated caustic solution, followed by contacting the layer with an acidic solution, and then rinsing the layer to remove the solutions and any solid reaction products.

While not relied upon to define the invention, it is felt that this surprising result is due at least in part to the relatively low water content of the caustic solution, enabling the etching reaction to be substantially self-limiting due to the relatively rapid loss of the water by evaporation, and the consequent recrystallization of the sodium hydroxide.

The subsequent treatment with acidic solution substantially preserves the integrity of the thus formed pattern by redissolving and neutralizing the recrystallized sodium hydroxide, as well as neutralizing any residual caustic solution.

The solutions and any reaction products are then removed by rinsing. Depending upon the pH of the acidic solution, one or more intermediate treatments may be employed between the initial acidic treatment and rinsing. For example, an intermediate treatment solution having a lower pH than that of the initial solution may be used in order to lower the pH of the residual solution prior to rinsing.

Thus, in accordance with one aspect of the invention, there is provided a method for forming a patterned aluminum layer on a substrate, the method comprising the steps of:

(a) forming a patterned masking layer of a caustic resistant material on the aluminum surface, (b) etching the masked aluminum layer by contacting the surface with a caustic etching solution, and (d) rinsing the patterned surface to substantially completely remove the solutions and any reaction products of the solutions, and (e) drying the surface, characterized in that the caustic solution contains at least 45 percent by weight of water, remainder sodium hydroxide, at a temperature of about 100 to 150 degrees F., and contacts the surface for a time sufficient to substantially completely remove the exposed portions of the aluminum layer, leaving a patterned aluminum layer on the surface of the substrate underlying the patterned masking layer, and further characterized in that the resultant patterned surface of the substrate is contacted with an acidic solution prior to rinsing and drying, to substantially prevent etching of the underlying aluminum pattern by undercutting of the masking layer.

In accordance with a preferred embodiment of the method, the substrate is a continuously moving web, the masking layer is formed by continuously printing a pattern of the caustic resistant material onto the moving aluminum layer, the masked aluminum layer is etched by continuously printing a layer of the caustic solution onto the moving masked surface, and etching is stopped by continuously printing a layer of the acidic solution onto the moving etched surface.

In accordance with another aspect of the invention, there is provided an article of manufacture comprising:

(a) a substrate, (b) a thin, patterned aluminum layer on at least one surface of the substrate, and (c) a thin, patterned layer of a caustic resistant material overlying the aluminum layer, characterized in that at least a portion of the pattern is a micropattern having a line width of from about 0.2 to 10 mils.

BRIEF DESCRIPTION OF THE DRAWING

The invention will now be described in terms of a limited number of preferred embodiments which are illustrated in the drawing, in which:

FIG. 1 is a diagrammatic section view of a multistation printing press which has been adapted to carry out the method of the invention, each station shown representing one step of the process; and FIG. 2 is a diagrammatic perspective view of a portion of a substrate bearing one element of a pattern in accordance with the invention.

DESCRIPTION OF THE PREFERRED EMBODIMENTS

Referring now to FIG. 1, the first station of multistation printing press 10 is an unwind station (not shown) in which an aluminized web 12 is fed from a roll. As is known, this station may contain web guiding, tension controlling and splicing elements.

The aluminized web is typically composed of a transparent substrate such as a polyester film having a thickness of about 0.5 to 3 mils (1 mil=0.001 inch), and on the upper surface of the film a vacuum evaporated aluminum layer having a thickness of about 500 to 1000 Angstroms. The web speed may range from about 100 to 150 feet per minute, but is preferably about 110 to 130 feet per minute.

From the unwind station, web 12 is fed into station 14, where it passes between print roller 17 and impression roller 18, where the upper, aluminized surface receives a precise amount of a caustic resistant U.V. curable resin 15 from print roller 17, in a pattern corresponding to the desired aluminum pattern, applied for example by flexographic plate, not shown, mounted on print roller 17.

Resin 15 is pumped from a reservoir to shallow pan 21, where it is picked up by fountain roller 22 and transferred to ceramic anilox 23, which has a cellular surface, so that a precise amount of resin can be delivered to print roller 17.

Resin 15 must be caustic resistant. In addition, for microprinting applications, it should also be printable in very thin layers, e.g., 0.1 mil or less, in line widths of as little as 0.2 mils. Preferred resins for this purpose are U.V. curable resins, which are available commercially in a wide variety of formulations, including inks, coatings, monomers and oligomers. U.V. curable materials are described in the following U.S. Pat. Nos.: 3,297,745; 3,380,381; 3,673,140; 3,770,643; 3,712,871; and 3,804,736.

A U.V. curable resin which has been found particularly suitable for the practice of the invention comprises a diacrylate ester of bisphenol A type epoxy resin, a blend of difunctional and trifunctional acrylate monomers, a photoinitiator, an accelerator and a surfactant. A resin of this type is currently available from Polychrome Chemicals Corp., Bloomfield, N.J., and is marketed under the tradename Rayvex AD29.

It will be appreciated that the caustic resistance of the very thin resin layers required for microprinting may be adversely affected by uneven layer thicknesses. Discontinuities in the resin layer, such as pinholes occurring during printing or subsequently by attack from the caustic solution, may be minimized by adjusting the viscosity of the resin or by heating it moderately, for example, to a temperature of about 110 degrees F., prior to application.

Following application of the resin pattern to the aluminized surface, the web moves into U.V. curing station 25, in which the resin is cured by exposure to a U.V.-emitting lamp, located inside housing 26. Since such curing generally imparts the desired caustic resistance to the resin, it should be substantially completed prior to the caustic etching step. However, since U.V. lamps often generate considerable thermal energy, care must be taken to avoid overheating, which could cause distortions such as wrinkles, and lead to the resin layer pulling away from the web. For microprinting applications, a tubular, 200 watt lamp, oriented transverse to the direction of web travel, and located in a parabolic reflector about 5 inches above the web, has been found to be satisfactory.

The web next moves to caustic etching station 27, where it travels around idler roller 28, and then around ceramic anilox 30, where it picks up a layer of caustic etchant, typically up to about 2 mils in thickness. Etchant 31 is supplied from a reservoir to shallow pan 34, where it is picked up by fountain roller 35 and transferred to anilox 30.

The concentration of the caustic solution and the temperature of etching are chosen to achieve a rate of etching sufficient to achieve substantially complete removal of the exposed aluminum from the web at about the same time that the NaOH crystallizes out of the solution due to loss of water through evaporation, the time required being sufficiently short to avoid undercutting of the resin mask, exposing the underlying aluminum to attack.

In general, it has been found that the amount of water in the caustic solution should range from about 45 to 55 percent by weight, above which the etching rate will be too fast, and below which the water may evaporate too quickly, causing NaOH to crystallize out before the exposed aluminum is entirely removed.

The temperature of the solution should in general range from about 100 to 150 degrees F., above which the water may evaporate too quickly, and below which the etching rate will be too slow, increasing the likelihood of forming pin holes in the resin mask, exposing the underlying aluminum to attack.

For the above conditions, the exposed aluminum layer is typically removed in less than 1 second, for example, 0.1 second.

Caustic solution 31 is maintained at a temperature of about 110 to 140 degrees F., and continuously agitated in order to keep the NaOH crystals in solution. The concentration of the caustic solution is continuously monitored by measuring the specific gravity of the solution with a hydrometer. By way of example, at 110 degrees F., the specific gravity of the solution ranges from about 1.43 at 50 percent water to about 1.60 at 45 percent water.

Due to the significant cooling effect of the rollers in contact with the moving web, it has been found necessary to heat at least rollers 30 and 35 in order to prevent excessive cooling of the etching solution. This can readily be accomplished by blowing warm air onto the rollers.

Following etching, the web moves around idling rollers 42 and 43, and into hot air dryer 44, which reduces the web to a damp condition with a stream of air at a temperature of about 130 degrees F., before it enters station 45.

At station 45, the web passes around idler roller 46, and picks up a layer of acidic rinse solution 48, typically up to about 2 mils in thickness, by passing between anilox roller 49 and fountain roller 50.

Roller 50 picks up acidic solution 48 from shallow pan 58, which is supplied from a reservoir. From roller 50, the web then travels around idling rollers 55 and 56, before exiting acid rinse station 45.

It is critical that the acid rinse take place as soon as possible after the exposed aluminum film has been substantially completely removed from the web, in order to neutralize any residual caustic solution and prevent attack of the resin and the underlying aluminum film, typically within three seconds or less. By way of example, where the web speed is about 120 feet per minute, and the distance from the metering roller 41 (the approximate location where the etching is completed) to the fountain roller 50 is about 60 inches, then the time between the completion of etching and the start of the acid rinse is about 2.5 seconds.

The pH of acidic solution 48 should in general fall within the range of about 2 to 5, above which the solution may be too weak to neutralize the caustic solution in time to prevent attack of the resin, and below which the solution may have sufficient strength to attack the resin itself. Based on the above considerations, a pH within the range of about 2.5 to 3.5 is preferred.

While hydrochloric acid is preferred for the acidic solution, other strong mineral acids such as nitric and sulfuric, as well as weak acids such as citric and acetic may also be used.

After leaving acidic rinse station 45, web 12 enters the final rinse station 60, where it travels around idler roller 61 and then passes between fountain roller 62 and anilox 63, where it picks up rinse solution 57 from shallow pan 68, supplied from a reservoir.

The purpose of the final rinse is to clean the web of substantially all of the residue of the caustic and acidic solutions, including any reaction products such as sodium chloride and aluminum hydroxide, as well as any contaminants which may be present. Thus, the pH of the rinse solution is not critical, and may range from moderately acidic to slightly basic, for example, from about 5 to 7.5. Ordinary tap water may be used.

Following the final rinse, the web 12 moves around idler rollers 65 and 66, and is dried by passing through hot air dryer 70, at a temperature of about 130 degrees F., and is then guided onto a take up roll, not shown.

Between each station, guide rollers 19, 29, 59 and 69 reverse the direction of the web 12 and guide it to the next station.

FIG. 2 shows a section of web 12 after completion of the process, with a character of a typical micropattern, the letter "U", made up of aluminum layer 100 and overlying resin layer 110, the letter having a line width "W" of about 1 mil.

The invention has been described in terms of a limited number of embodiments. Various other embodiments will become apparent to those skilled in the art from the above description, and these other embodiments are intended to be encompassed within the scope of the invention as set forth in the accompanying claims.

For example, while the invention has been described in terms of a flexographic printing process, other printing processes are also suitable, such as roto-gravure, lithography, silk screen, and letter press.

What is claimed is:

1. A method for forming a patterned aluminum layer on the top surface of a substrate, the method comprising the steps of:
   (a) providing a substrate having an aluminum layer on a top surface thereof,
   (b) forming a patterned masking layer of a caustic resistant material on the aluminum surface,
   (c) etching the masked aluminum layer by contacting the masked aluminum layer with a caustic etching solution,
   (d) rinsing the patterned aluminum layer to substantially completely remove the solution and any reaction products of the solution, and
   (e) drying the patterned aluminum layer, wherein the caustic etching solution contains from about 45 percent to 55 percent by weight of water, remainder sodium hydroxide, and is essentially saturated at a temperature of about 100 to 150 degrees F., and contacts the masked aluminum layer for a time sufficient to substantially completely remove any exposed portions of the masked layer, leaving a patterned aluminum layer on the surface of the substrate underlying the patterned masking layer,
   and further comprising the step of contacting the resultant patterned surface of the substrate with an acidic solution prior to rinsing and drying to substantially prevent etching of the underlying patterned aluminum layer by undercutting of the masking layer.

2. The method of claim 1 in which the masking layer is substantially optically transparent.

3. The method of claim 1 in which the masking layer is formed by applying a patterned layer of a U.V.-curable resin to the aluminum layer, and irradiating the patterned layer of a U.V.-curable resin with U.V. light.

4. The method of claim 3 in which the resin composition comprises a diacrylate ester of bisphenol epoxy resin, a difunctional acrylate monomer, a trifunctional acrylate monomer, and a photoinitiator.

5. The method of claim 2 in which the substrate is substantially optically transparent.

6. The method of claim 1 in which the acidic solution has a pH of from about 2 to 5.

7. The method of claim 6 in which the pH is from about 2.5 to 3.5.

8. The method of claim 7 in which the acid is hydrochloric acid.

9. The method of claim 6 in which the acid comprises mineral acid.

10. The method of claim 1 in which the substrate is a continuously moving web, the masking layer is formed by continuously printing a pattern of the caustic resistant material onto the moving aluminum layer, the masked aluminum layer is etched by continuously printing a layer of the caustic solution onto the moving masked aluminum layer, and etching is stopped by continuously printing a layer of the acidic solution onto the moving etched aluminum layer.

11. The method of claim 10 in which the web is moving at a speed of from about 120 to about 150 feet per minute.

12. The method of claim 11 in which the thickness of the caustic layer is up to about 2 mils.

13. The method of claim 11 in which the thickness of the acidic layer is up to about 2 mils.

14. The method of claim 1 in which the time of etching is up to about 1 second.

15. The method of claim 14 in which the patterned surface of the substrate is contacted with the acid solution within about 3 seconds after etching.

16. The method of claim 1 in which the thickness of the masking layer is up to about 0.1 mil.

17. The method of claim 1 in which the substrate is substantially optically transparent.

* * * * *